(12) United States Patent
Jeong et al.

(10) Patent No.: US 10,083,118 B2
(45) Date of Patent: Sep. 25, 2018

(54) KEY VALUE-BASED DATA STORAGE SYSTEM AND OPERATION METHOD THEREOF

(71) Applicant: SAMSUNG ELECTRONICS CO., LTD., Gyeonggi-do (KR)

(72) Inventors: Bokdeuk Jeong, Gyeonggi-do (KR); Sungmin Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 14/775,801

(22) PCT Filed: Mar. 7, 2014

(86) PCT No.: PCT/KR2014/001868
§ 371 (c)(1),
(2) Date: Sep. 14, 2015

(87) PCT Pub. No.: WO2014/142473
PCT Pub. Date: Sep. 18, 2014

(65) Prior Publication Data
US 2016/0041918 A1    Feb. 11, 2016

(30) Foreign Application Priority Data

Mar. 14, 2013   (KR) ........................ 10-2013-0027135

(51) Int. Cl.
*G06F 12/0893*    (2016.01)
*G11C 15/04*    (2006.01)
(Continued)

(52) U.S. Cl.
CPC ...... *G06F 12/0893* (2013.01); *G06F 12/0246* (2013.01); *G06F 17/30218* (2013.01); *G11C 15/046* (2013.01); *G06F 2212/222* (2013.01)

(58) Field of Classification Search
CPC .................................................. G06F 12/0893
(Continued)

(56) References Cited

U.S. PATENT DOCUMENTS

2006/0195450 A1    8/2006  Chatterjee et al.
2009/0067631 A1    3/2009  Gupta
(Continued)

FOREIGN PATENT DOCUMENTS

KR    1020130018602    2/2013

OTHER PUBLICATIONS

International Search Report for PCT/KR2014/001868 dated Jun. 27, 2014.
(Continued)

*Primary Examiner* — Gautam Sain
(74) *Attorney, Agent, or Firm* — McAndrews, Held & Malloy, Ltd.

(57) ABSTRACT

The present invention relates to a data storage system. The present invention provides a key value-based data storage system and an operation method thereof, the data storage system comprising: computing nodes, each of which includes a substrate module, a central processing unit, a memory arranged in the substrate module, and a NAND flash storage for cache storage; and a communication interface for interconnecting the computing nodes, wherein the computing nodes support key value-based data processing.

13 Claims, 8 Drawing Sheets

(51) Int. Cl.
*G06F 12/02* (2006.01)
*G06F 17/30* (2006.01)

(58) Field of Classification Search
USPC .......................................................... 711/103
See application file for complete search history.

(56) References Cited

U.S. PATENT DOCUMENTS

| | | |
|---|---|---|
| 2011/0276744 A1 | 11/2011 | Sengupta et al. |
| 2012/0185437 A1* | 7/2012 | Pavlov .............. G06F 17/30094 |
| | | 707/652 |
| 2012/0310882 A1 | 12/2012 | Werner et al. |
| 2013/0042060 A1 | 2/2013 | Marukame et al. |
| 2013/0117225 A1* | 5/2013 | Dalton .............. G06F 17/30079 |
| | | 707/623 |
| 2013/0250686 A1* | 9/2013 | Marukame ............. G11C 16/08 |
| | | 365/185.12 |
| 2013/0346365 A1* | 12/2013 | Kan ........................ G06F 3/061 |
| | | 707/610 |
| 2014/0149537 A1* | 5/2014 | Shankaran .......... H04L 67/2842 |
| | | 709/216 |
| 2014/0359044 A1* | 12/2014 | Davis ..................... H04L 45/60 |
| | | 709/213 |

OTHER PUBLICATIONS

D. Anderson, et al., "FAWN: A Fast Array of Wimpy Nodes", In Proc. 22nd ACM Symposium on Operating Systems Principles (SOSP) Oct. 11-14, 2009.

\* cited by examiner

KEY VALUE-BASED DATA STORAGE SYSTEM AND OPERATION METHOD THEREOF

CROSS-REFERENCE TO RELATED APPLICATIONS/INCORPORATION BY REFERENCE

This application is a 371 of International Patent Application No. PCT/KR2014/001868, filed Mar. 7, 2014, entitled "KEY VALUE-BASED DATA STORAGE SYSTEM AND OPERATION METHOD THEREOF", which claims priority to Korean Patent Application No. 10-2013-0027135, filed Mar. 14, 2013, entitled "KEY VALUE-BASED DATA STORAGE SYSTEM AND OPERATION METHOD THEREOF". The above-identified applications are hereby incorporated herein by reference in their entirety.

TECHNICAL FIELD

The present invention relates to key-value storage systems, and more particularly, to a key-value-based data storage system with low-power and high performance for supporting the input/output of data, and a method of operating the system.

BACKGROUND ART

A method of storing real data in a DataBase Server (DBS) using Mem-cache-D (Memcached) serving as a key-value cache server uses a distribution cache server and selects a cache node from a client library through consistent hashing to process the input/output of data. The client program is in charge of cache management and processes the data with a cache server and a DBS, separate from the client program.

In a Fast Array of Wimpy Nodes (FAWN), suggested by Carnegie Mellon University (CMU), key-value storage is configured with a cluster including a Solid State Disk (SSD) and a node with low-specificity; wherein the client accesses one front-end node to request a key-value operation. The front-end designates a backend node to store a corresponding key-value via consistent hashing, according to the request from the client, and requests the back-end node to store data thereon. The front-end keeps the result of the request in memory to provide the cashed data to the client without the back-end node when the get operation is performed later.

In conventional art, the method using the structure of Memcached has been used to improve the performance of the get operation and the high performance server-based key-value storage. However, the conventional Memcached based method is disadvantageous in that: a large amount of energy is consumed; the client needs to be directly in charge of cache management; and, when a cache miss occurs, communication is performed twice with the server (once by the Memcached and once again by a storage server), which causes a communication overhead.

In the conventional FAWN system, since the client accesses only one service front-end node to receive a key-value service, a bottleneck at a specific front-end node occurs; and since a cache is maintained only on the memory of the service front-end node, the cache is small in size.

SUMMARY OF THE INVENTION

The present invention has been created in view of the above problems, and provides a key-value-based data storage system with low power and high performance, in which a key-value storage system is configured based on a cluster with a high-performance storage, e.g., a NAND Flash storage, and an idle memory of each storage node is used as a cache. The present invention further provides a method of operating the key-value-based data storage system.

In accordance with an embodiment of the present invention, the present invention provides a key-value-based data storage system including: computing nodes each of which comprises a board corresponding to a substrate module, a central processing unit (CPU) disposed on the substrate module, a memory disposed on the substrate module and a NAND flash memory for performing cache storage; and a communication interface for connecting the computing nodes. The computing nodes support a key/value-based data process.

Preferably, the computing node creates: a cluster comprising an ARM board on which an SD card/SSD is installed or an ARM board on which a NAND Flash storage is included in the form of System on chip (SoC); a cluster cooperating with a plurality of SSDs in which the ARM CPU, memory and NAND Flash storage are mounted; or a cluster as an ARM-based micro-server using an SSD through the virtualization of Input-Output (IO).

Preferably, the computing node includes: a plurality of storage nodes for storing key-value data, physically; at least one service front-end node for allocating key ranges to the plurality of storage nodes, respectively, to configure a key-value storage; and a storage master node configured as one of the service front-end nodes to manage at least one of the service front-end nodes.

Preferably, the service front-end node creates a cache cluster with the idle memory of the storage node to dynamically expand the cache size.

Preferably, the computing node allows software components configuring the node to operate as a microkernel-based user-level process and is provided in the form of a library according to the relationships between the components so as to operate a plurality of modules as one user-level process.

Preferably, when receiving a put operation request from a client node, the service front-end node stores a key value in a particular storage node, and maintains the storage result in the cache.

Preferably, when receiving a get operation request from a client node, the service front-end node looks up a cache and obtains a value through a corresponding storage node when a cache miss exists.

Preferably, software components included in the service front-end node, the storage master node and the storage node are operated on a microkernel or a monolithic kernel.

In accordance with another embodiment of the present invention, the present invention provides a method of operating a key-value-based data storage system including: requesting, by a client node, a read or write operation of a key-value data; according to the operation request, providing, to the client node, a list of at least one or more service front-end nodes for managing a plurality of storage nodes storing the key-value data; selecting, by the client node, a service front-end node to read or write the key-value data; and according to the request from the client node, writing or reading, by the selected service front-end node, the key-value data to or from a particular storage node, and providing the key-value data to the client node.

Preferably, the method further includes: selecting one of the service front-end nodes as a storage master node; and creating and managing, by the storage master node, a list of the service front-end nodes.

Preferably, the method further includes: allocating, by the service front-end node, the key ranges to the plurality of storage nodes.

Preferably, the method further includes: creating, by the service front-end node, a cache cluster with the idle memory of the storage node, and dynamically expanding the cache size.

Preferably, the provision includes: receiving, by the service front-end node, a put operation request from a client node; storing a key value in a particular storage node; and maintaining, by the storage node, the storage result in the cache.

Preferably, the provision includes: receiving, by the service front-end node, a get operation request from the client node; looking up a cache by the service front-end node; and obtaining, by the service front-end node, a value through a corresponding storage node when a cache miss exists.

Preferably, the method includes creating a cluster for the key-value-based data storage system by the computing nodes that comprises an ARM board on which an SD card/SSD is installed or an ARM board on which a NAND Flash storage is included in the form of System on chip (SoC).

Preferably, the method includes creating a cluster for the key-value-based data storage system by the computing nodes cooperating with a plurality of SSDs in which the ARM CPU, memory and NAND Flash storage are mounted.

Preferably, the method includes creating a cluster for the key-value-based data storage system by the computing nodes implemented as an ARM-based micro-server using an SSD through the virtualization of Input-Output (IO).

Advantageous Effects of Invention

As described above, the key-value-based data storage system and the method of operating the system according to the present invention configure a distributed storage through ARM-based clustering, in an environment where a conventional high-performance server-based key-value storage and Memcached are use, thereby reducing the energy consumption.

In addition, the present invention performs the addition or removal of clusters adaptively according to the designer's intent to configure a scalable storage.

In addition, the present invention uses the idle memory of a storage cluster as cache, thereby increasing the resource efficiency of the node, and allows the client to directly control the cache management in the same way as the Memcached applying process, thereby reducing the communication overhead.

BRIEF DESCRIPTION OF DRAWINGS

The features and advantages of the invention will become more apparent from the following detailed description in conjunction with the accompanying drawings, in which.

DETAILED DESCRIPTION OF EMBODIMENTS

Figure 1:
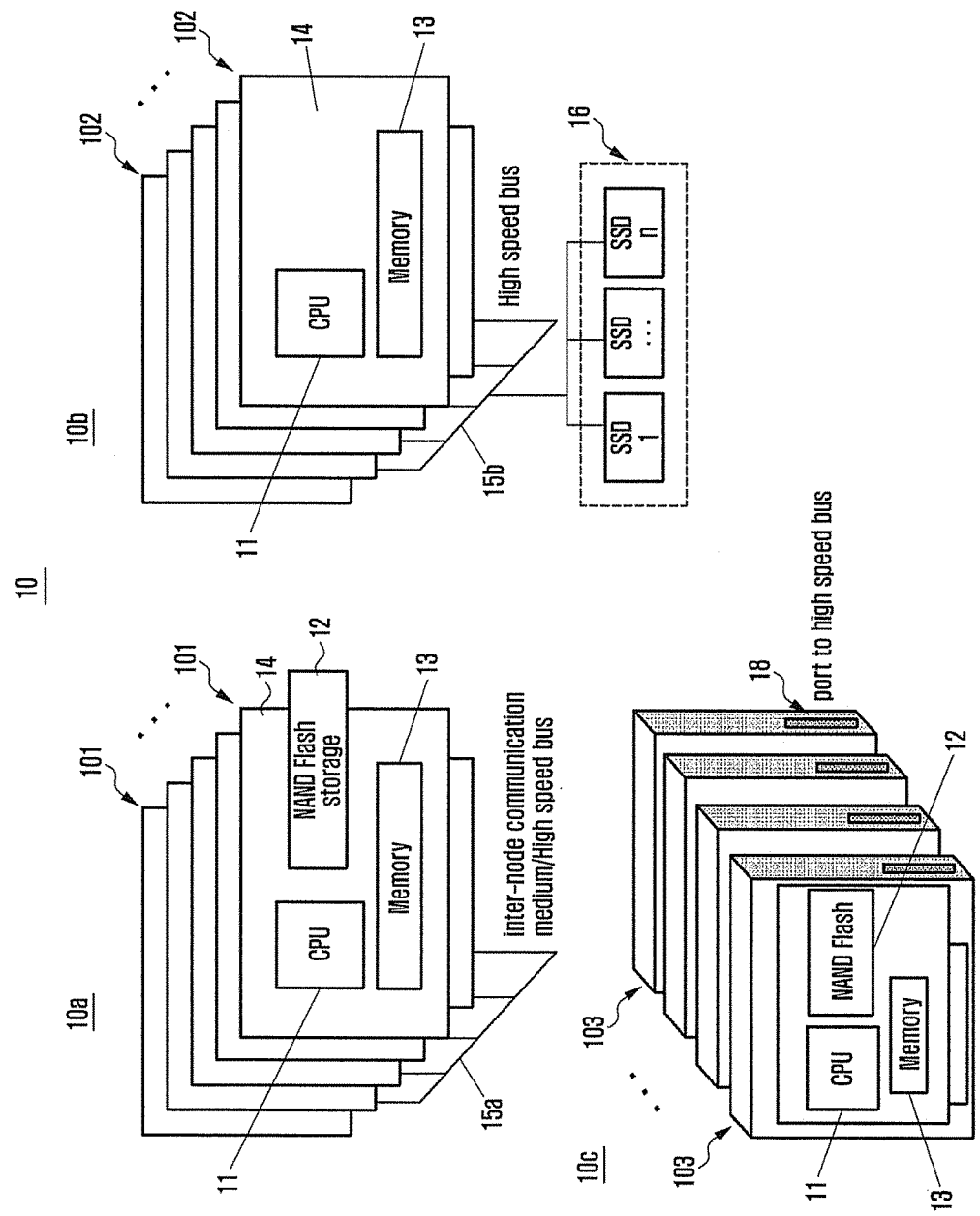
FIG. 1 is a diagram showing the data storage system of ARM cluster configurations according to an embodiment of the present invention.

Hereinafter, embodiments of the present invention are described in detail with reference to the accompanying drawings. Detailed descriptions of well-known functions and structures incorporated herein may be omitted to avoid obscuring the subject matter of the invention.

In addition, the accompanying drawings are not necessarily to scale and certain features are exaggerated or omitted in order to better illustrate and explain the invention. Therefore, it should be understood that the present invention is not limited to the shapes of elements in the drawings.

In the following description, the term 'key-value storage' refers to a storage or a storage device for storing data of a <key, value> pair, mainly storing a value of less than 1 KB. The term 'key-value get operation' or 'get operation' refers to an operation for finding a value by inputting a key value. The term 'key-value put operation' or 'put operation' refers to an operation for requesting the storage of a <key, value> pair.

A NAND Flash storage is low in demand power per byte and 10~100 times higher in terms of read/write speed compared with Hard Disk Drive (HDD) technology. The present invention uses the characteristics of low power and fast data access of NAND Flash storage, and configures an ARM cluster or ARM-based micro server as an IO intensive, key-value storage, using a low specification ARM board of which the computing power is lower than existing servers, thereby maximizing the effect of lower power. In addition, in order to overcome the problem that a period of 'write' time of NAND Flash storage increases as the block easing is performed, the present invention employs a technique for storing log structured data of append only type and a data buffer to store data in the NAND Flash storage in sequential write mode when requesting a put operation of a key-value, thereby improving the performance of write operation. The get operation for key-value is by performing read access in a distributed key-value storage. In order to overcome the problem that the data random read operation from the NAND Flash storage is slower than the sequential write operation, memories of each node are clustered to be used as a key-value cache, thereby simultaneously improving the performance of the put operation and the get operation.

FIG. 1 is a schematic diagram showing the configuration of ARM-based computing nodes for the construction of a key-value data storage system 10 using an ARM-based computing node as a cluster, according to an embodiment of the present invention.

Referring to FIG. 1, the data storage system 10 of the present invention is implemented with one from among a plurality of ARM-based computing nodes 01, 102, and 103. Each of the ARM-based computing nodes 101, 102, and 103 includes: a substrate module, e.g., ARM board 14; a central processing unit (CPU), e.g., ARM CPU 11; NAND Flash storage 12; a memory 13 and buses.

In the data storage system 10, a first type system 10a creates first type nodes 101 each of which is formed as an ARM CPU 11, a NAND Flash storage 12, and a memory 13 are installed to an ARM board 14, where the first type nodes 101 are connected to each other through a first type bus 15a. Part of the first type nodes 101 included in the first type system 10a may be operated as service front-end nodes, and the other nodes may be operated as storage nodes. The first type bus 15a: supports the connection between the first type nodes 101; transports clients requests from a client node to a corresponding node; and transmits, according to a request from a client node, data stored in the particular first type node to the client node. The first type system 10a may configure a cluster with ARM board 14 including the NAND Flash storage 12 in the form of System on Chip (SoC) or in the form of ARM board 14 to which SD card/SSD is installed.

In the data storage system 10, a second type system 10b creates second type nodes 102 each of which is formed as an ARM CPU 11 and a memory 13 are mounted on an ARM board 14, where the second type nodes 102 are connected to separate SSD storages 16 through a second type bus 15b. This configuration is implemented in such a way that the SSD storages 16 are separated from the second type nodes 102. Therefore, the second type bus 15b may create a cluster to operate the put operation or the get operation of the second type nodes 102 in the form of ARM-based microserver based on the specific SSD storages 16. The ARM-based micro-server is implemented with a key-value storage using an SSD through the virtualization of Input/Output (TO).

In the data storage system 10, a third type system 10c creates third type nodes 103 each of which is formed as an ARM CPU 11, a memory 13 and a NAND Flash storage 12 are packed, where the third type nodes 103 are connected to each other, through their third type bus ports 18, in bus connection, thereby creating a cluster. In particular, each of the third type nodes 103 of the third type system 10c includes an ARM board 14 on which an ARM CPU 11 corresponding to an ARM Processor is mounted and a cooperative SSD cluster that is formed as an ARM CPU 11 and a memory 13 are integrated in the NAND Flash storage 12 and that is capable of performing computing operations.

Meanwhile, the NAND Flash storage 12 may be included in each node in the foam of SoC or connected to a SD card/SSD through a system bus or interconnection fabric. Inter-node communication is made by using a network device, and high speed communication between cluster nodes is performed by using a system bus or interconnection fabric to provide short communication latency of less than a milli-second, thereby processing data at high speed.

Figure 2:
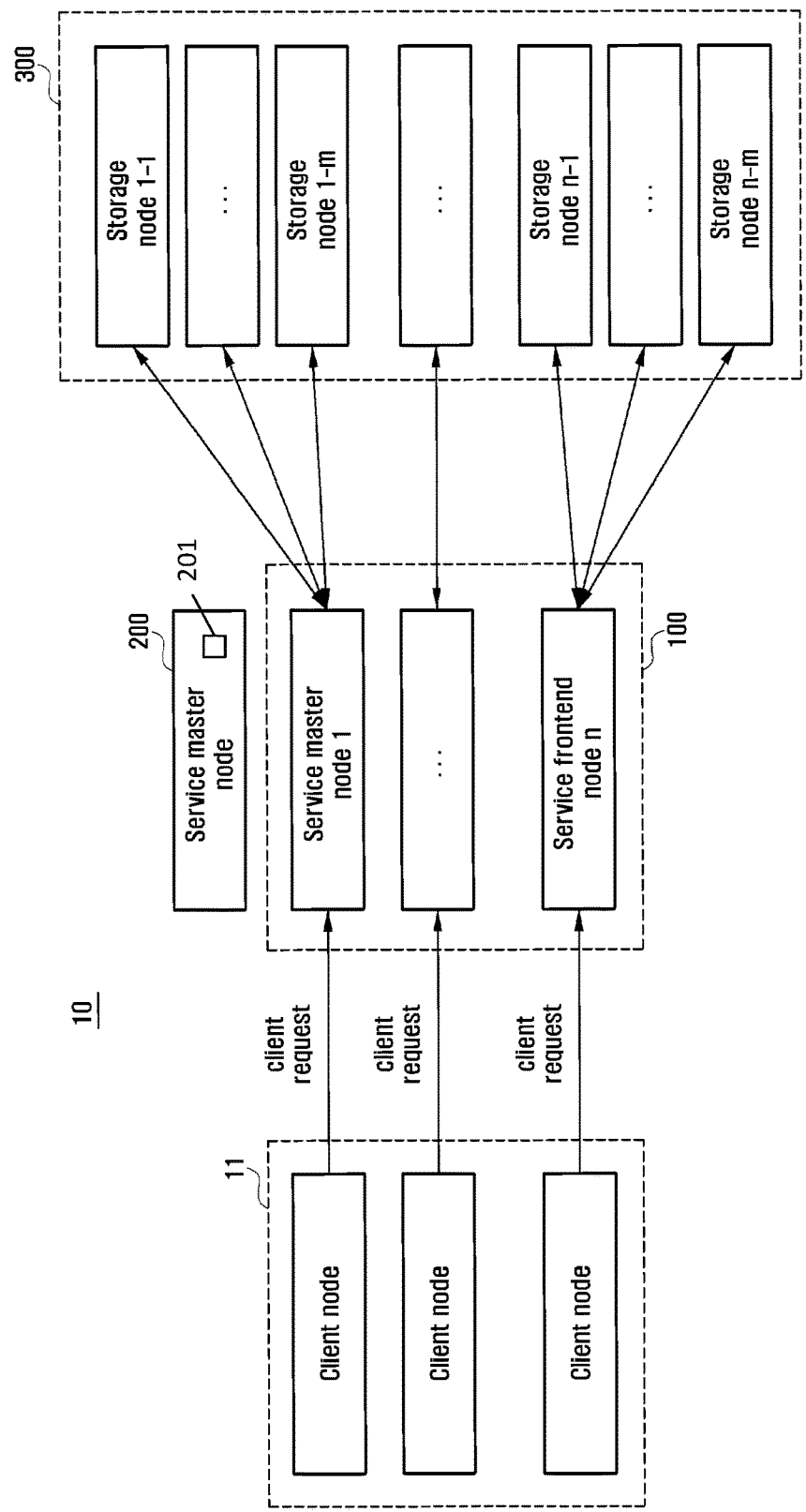
FIG. 2 is a diagram showing a node of the ARM cluster for the key-value-based data storage system.

FIG. 2 is a diagram showing nodes of a data storage system 10 shown in FIG. 1, classified according to the functions to configure a distributed storage system.

Referring to FIG. 2, each of the nodes on the cluster included in the data storage system 10 are classified into, according to the functions: a service master node or storage master node (hereinafter called a storage master node) 200; a service front-end node 100; and a storage node 300. The data storage system 10 includes: one storage master node 200 in charge of node management; one or a plurality of client nodes service front-end nodes 100 for providing a key-value storage service to the client node 1; and one or more storage nodes 300 for storing and managing real key-value data.

The storage master node 200 manages node membership according to node join/leave. In particular, the storage master node 200 performs a process of key range assign to be controlled when the service front-end node 100 is joined, and becomes one of the front-end service nodes 100.

When a plurality of service front-end nodes 100 are used, each service front-end node 100 performs a key-space partitioning process through consistent hashing, thereby providing a key-value storage service based on an exclusive key range between service front-end nodes 100. As service front-end nodes 100 are communicated to each other, a list of service front-end nodes (front-end list) in charge of respective key ranges is maintained and updated. When connecting to a client node 1, items of service front-end nodes according to key ranges are transmitted.

The client node 1 may: obtain a list 201 of service front-end nodes from the storage master node 200; check information about service front-end nodes 100 according to respective key ranges; directly connect to respective service front-end nodes 100; and perform a put operation or a get operation for the <key, value> pair.

The storage node 300 is dependent on one service front-end node 100. The storage node 300: is in charge of a sub-range of a key range that the dependent service front-end node 100 has been in charge of; and stores and manages key-value data. For a key range that each storage node 300 will be in charge of and the service front-end node 100 that each storage node 300 will bind with, when the storage node 300 receives a joining request from the storage master node 200, it is determined by the storage master node 200.

The memory 13 disposed in the storage node 300 creates an index table including information about storage offset, storing respective key-values, or is used as a buffer for storing key-value data before it is stored in the NAND Flash storage 12. In addition, the idle memory space is provided cache space to the service front-end node 100.

That is, the storage node 300 serves as a member node of a cache cluster that the service front-end node 100 needs, so that it can shorten the period of time to perform a random read operation by a key-value storage based on a NAND Flash storage, where the access time is relatively long when data is read out from the NAND Flash storage. Therefore, the data storage system 10 of the present invention can enhance Queries Per Second (QPS) for read access and simultaneously improve the resource use of the storage node 300.

Meanwhile, the data storage system 10 of the present invention implements all of the software stack of the respective configured nodes based on a Micro kernel. Accordingly, the data storage system 10 of the present invention only includes programs and user-level Operating System (OS) services required for the respective nodes, and supports the optimum system. In addition, the data storage system 10 may be implemented in such a way that software modules are operated by a monolithic kernel as well as a microkernel.

Figure 3:
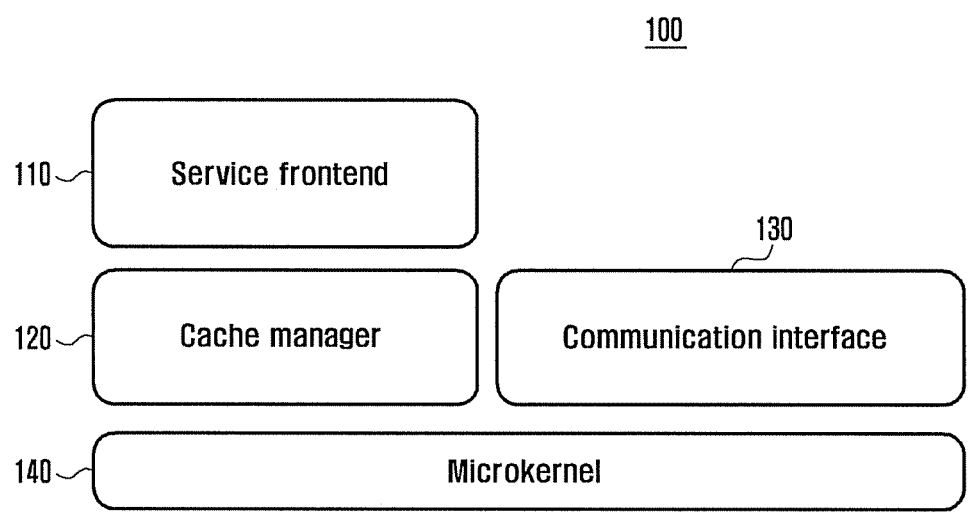
FIG. 3 is a diagram showing the software architecture of a service front-end node according to the present invention.
Figure 4:
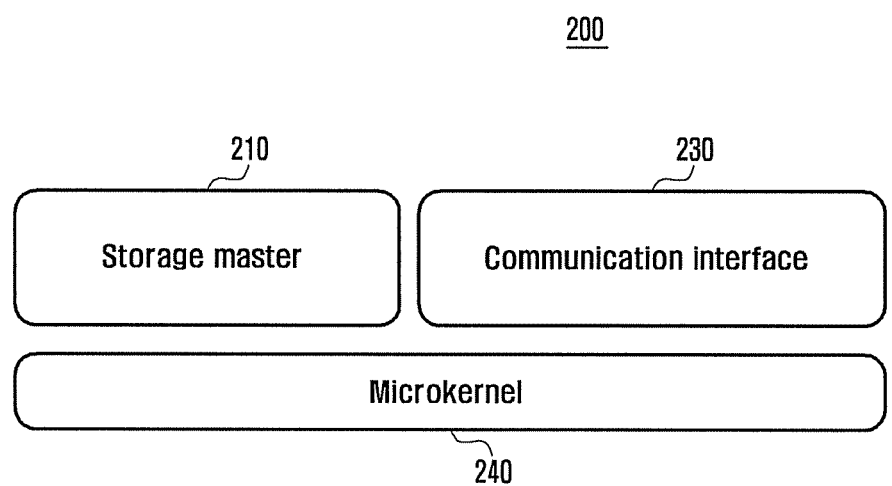
FIG. 4 is a diagram showing the software architecture of a storage master node according to the present invention.
Figure 5:
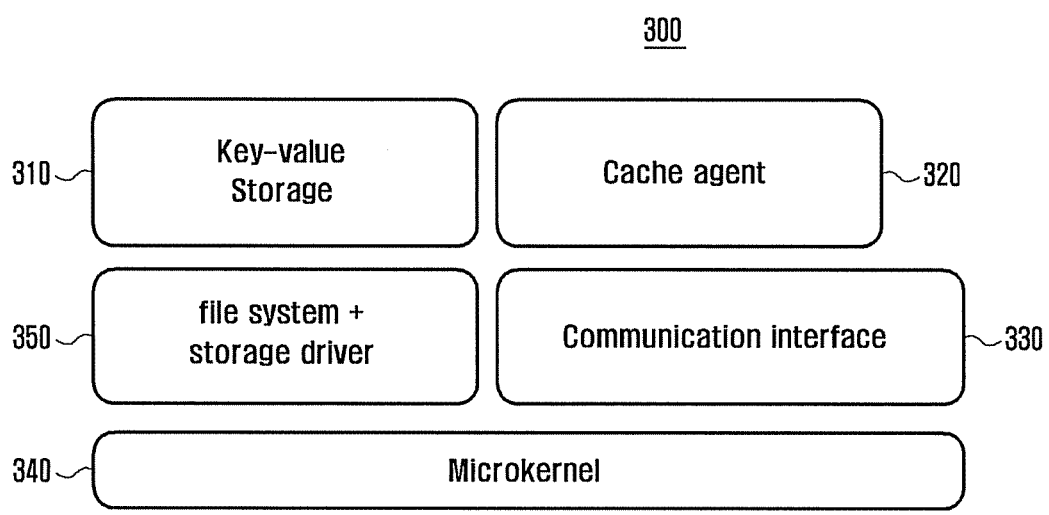
FIG. 5 is a diagram showing the software architecture of a storage node according to the present invention.

FIGS. 3 to 5 are diagrams showing the software stacks implemented in the respective nodes of the data storage system 10 according to the present invention. More specifically, FIG. 3 is a diagram showing a service front-end module disposed in the service front-end node according to the present invention. FIG. 4 is a diagram showing a storage master module disposed in the storage master node according to the present invention. FIG. 5 is a diagram showing a storage module disposed in the storage node according to the present invention. In order to improve the performance in the architecture of each of the nodes in the data storage systems 10 shown in FIGS. 3 to 5, modules displayed as user-level may operate as one processor in the same address space, according to the relationships between modules.

In the following description, the service front-end module shown in FIG. 3, the storage master module shown in FIG. 4, and a key-value storage shown in FIG. 5 are provided with a communication interface module in the form of a library, which may operate on the same process. Each of the nodes included in the data storage system 10 according to another embodiment may be configured as a user-level program that provides Linux-based key-value services. That is, software components of the present invention operate as microkernel-based user-level processes. Therefore, the system of the present invention provides modules in the form of libraries according to the relationships between components, so that a plurality of modules operate as one user-level process, thereby improving overall performance.

Referring to FIG. 3, the front-end service node 100 of the present invention includes a service front-end 110, a cache manager 120, a first communication interface 130, and a first microkernel 140. The front-end service 110, the cache manager 120, and the first communication interface 130 each operate as a user-level process. The configurations operating as user-level processes are implemented on the first microkernel 140 and the operations are controlled according to the first microkernel 140.

The service front-end 110 maintains information about the storage nodes 300 according to corresponding key ranges in the index table on the memory 13. When receiving a request for performing a key-value operation from the client node 1, the service front-end 110 searches for a storage node 300 in charge of a corresponding key through the index table lookup to request a key-value operation. The results of the put operation-based Put key-value operation are stored in a cache corresponding to the NAND Flash storage 12.

The first communication interface 130 may establish a communication channel with the client node 1 based on the first microkernel 140 so that the first communication interface 130 can receive a request for performing a put operation or a get operation from the client node 1. The first communication interface 130 establishes communication between the nodes. When the communication interface of a node is implemented as a network interface, the first communication interface 130 performs socket communication. When the communication interface of a node is implemented as a high-speed communication bus, such as PCIe or interconnection fabric, the first communication interface 130 performs communication through the bus.

The cache manager 120 performs a cache managing process of the storage node 300 to control the get operation for collecting data stored in the NAND Flash storage 12 or the put operation for storing data in the NAND Flash storage 12, according to the request of the service front-end 110. That is, the cache manager 120 checks the states of the storage nodes 300 to access a cache to read and write data, and provides the processed results of the read and write operations to the service front-end 110. In the process, when the cache manager 120 receives an execution for a corresponding task from the service front-end 110 according to a request for performing the get operation from the client node 1, the cache manager 120 checks a condition as to whether a corresponding value exists in a cache before transmitting the operation to the storage node 300. When a corresponding value has not existed in a cache, the cache manager 120 transmits the operation to the storage node 300.

More specifically, the cache is configured by using the space of the memory 12 of the storage node 300 that belonged to a key range that the service front-end node 100 is in charge of. The cache manager 120 of the service front-end node 100 determines which memory space of the storage node 300 the key-value is cached in, and maintains, in the form of hash table, information about each of the storage nodes 300 where cached data exist. The hash table with cache information is resized each time that the storage node 300 is added or removed, and creates one logical bucket array by increasing or decreasing the memory space to be used as a cache.

Referring to FIG. 4, the storage master node 200 of the present invention includes a storage master 210, a second communication interface 230, and a second microkernel 240. The storage master node 200 performs the management, data allocation and communication control between the service front-end node 100 and the storage node 300.

The storage master 210 manages the membership of the service front-end node 100 and the storage node 300. The storage master 210 assigns key ranges to the respective nodes of the data storage system 10.

The second communication interface 230 communicates with other nodes. The second communication interface 230 may perform bus communication or socket communication as the first communication interface 130 described above. In particular, the second communication interface 230 performs communication with the service front-end nodes 100 and storage nodes 300, and supports the storage master 210 to establish a communication channel to manage the entire membership of the respective nodes.

The second microkernel 240 supports the transmission and processing of data and signals for operating the components of the storage master node 200. The second microkernel 240 transmits commands from the storage master 210 to other nodes through the second communication interface 230. The second microkernel 240 transmits, to the storage master 210, data that other nodes provides to the second communication interface 230. The storage master 210 supports a function for the operation, such as the allocation of key ranges by the storage master 210, etc.

Referring to FIG. 5, the storage node 300 of the present invention includes a key-value storage 310, a cache agent 320, a system driver 350, a third communications interface 330 and a third microkernel 340. The key-value storage 310 performs the storage or read operation to/from a storage media according to the request of a key-value pair from the service front-end node 100. The key-value storage 310 performs a sequential write operation by using log-structured data stored as append-only type, thereby supporting the NAND Flash storage 12 to optimize the advantage of the fast performance of sequential write operation as it is. The cache agent 320 reports the idle memory space of the storage node 300 to the cache manager 120 of the service front-end node 100 to use the space in caching.

The system driver 350 includes file systems and storage drivers to perform the storage of files and the support of drivers. The third communication interface 330 establishes communication channels with other nodes to be connected to the storage node 300, based on the third microkernel 340. That is, the third communication interface 330 establishes communication channels with the service front-end node 100 and the storage master node 200 to support the transmission of data requested by corresponding nodes and the storage of data provided by corresponding nodes. The storage nodes 300 belongs to the service front-end nodes 100, are assigned sub-key ranges of a certain range of key, and supports the read and write operations of data corresponding to the allocated ranges.

Figure 6:
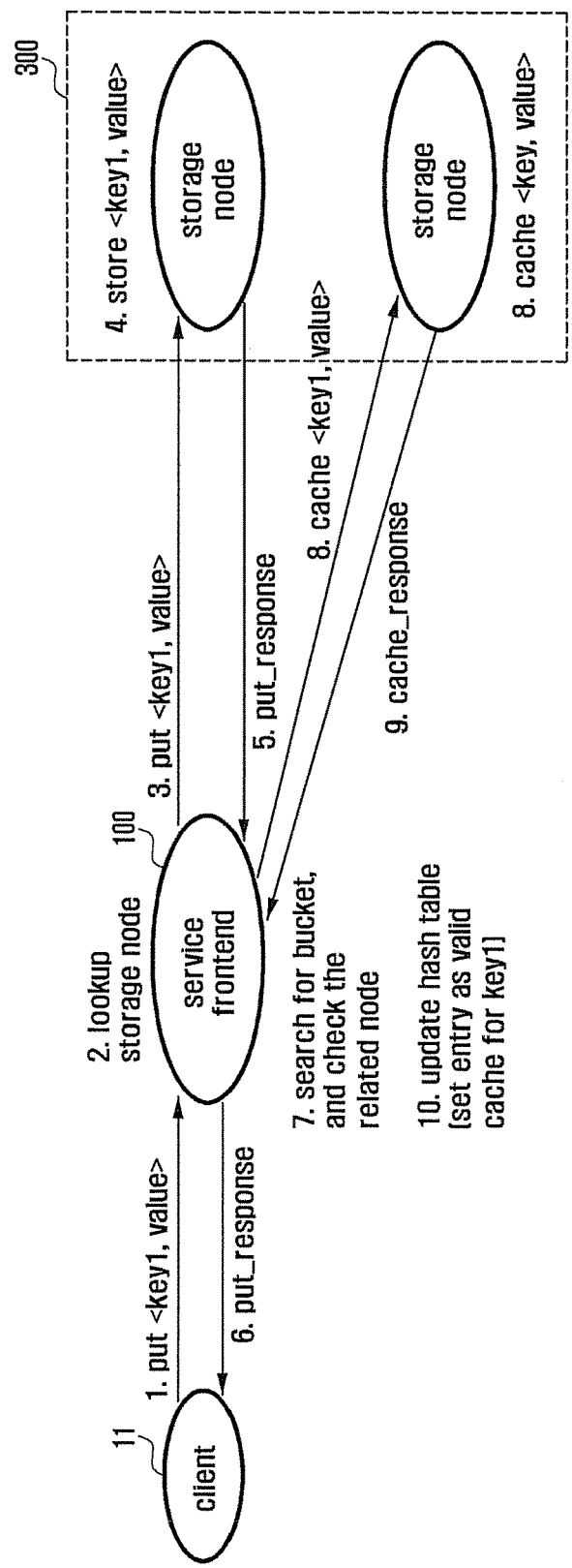
FIG. 6 is a diagram describing the process of performing a put operation according to the present invention.

FIG. 6 is a diagram describing the put operation, or a write operation, of the data storage system 10 according to an embodiment of the present invention.

Referring to FIG. 6, in order to perform a put operation of the present invention, the client node 1 requests put <key1, value> from the service front-end node 100. The front-end service node 100 performs a lookup operation of the storage node to identify a storage node 30a to transmit data that is provided by the client node 1 of the storage node 300. A node that receives the put operation request from the client node 1 may be the storage master node 200. The master storage node 200 may distribute the received, put operation request to a particular service front-end node 100. To this end, the storage master node 200 assigns key ranges to respective service front-end nodes 100. The storage master node 200 may be configured with one of the service front-end nodes 100. The storage master node 200 may be selected based on the agreement between the front-end nodes 100 or by the system designer. Meanwhile, the service front end node 100 checks the key range for performing the put operation, and supports: the selection of a storage node 30a according to the key range; and the transmission of the put message. To this end, the master storage node 200 may manage the membership and the list of service front-end nodes 100 to which key ranges are allotted.

Meanwhile, the service front-end node 100 provides the put <key1, value> to a particular storage node 30a. The storage node 30a performs the put <key1, value> operation and provides the response, put_response, to the service front-end node 100. After that, the service front-end node 100 may provide the put_response to the client node 1, thereby informing that the put operation for key 1 has been performed.

Meanwhile, the service front-end node 100 performs a bucket search and the related node identification task and provides a cache <key1, value> to a separate storage node 30b. The separate, storage node 30b is a configuration for a caching operation. When receiving a cache <key1, value> from the service front-end node 100, the separate storage node 30b caches it (cache <key, value>). The separate storage node 30b provides the cache response corresponding to the cached result to the service front-end node 100. When receiving the cached result from the separate storage node 30b, the service front-end node 100 updates the hash table to set an entry corresponding to a valid cache for key1.

Figure 7:
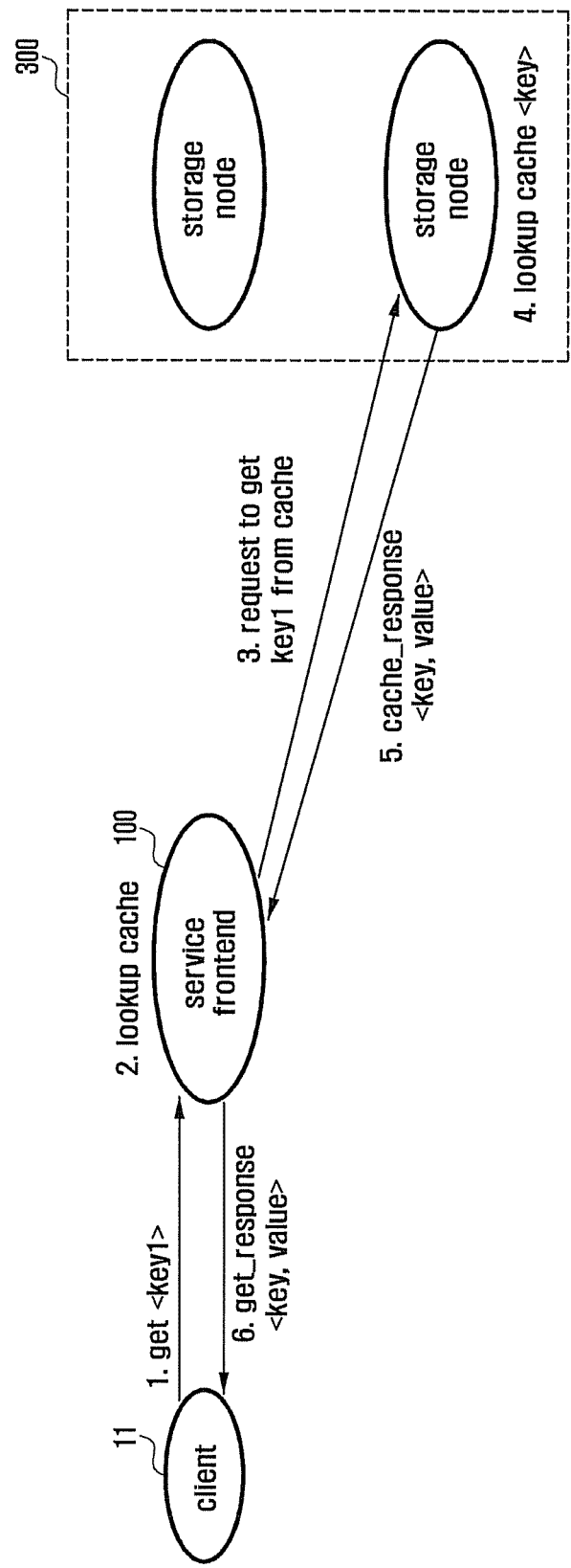
FIG. 7 is a diagram describing the process of performing a get operation according to the present invention.

FIG. 7 is a diagram describing the get operation, or a read operation, of the data storage system 10 according to an embodiment of the present invention.

Referring to FIG. 7, in order to perform the get operation of the present invention, the client node 1 provides a get <key1> to the service front-end node 100. The service front-end node 100 performs a lookup cache for the received, get <key1>, and identifies the storage node 300 in which the corresponding data has been stored. In the process, the storage master node 200 may check the key range to control the selection of the service front-end node 100 that has transmitted the get message. The service front-end node 100 checks the key1 of the get message to identify the storage node 300 that has included it. To this end, the service front-end node 100 may manage the information about the key ranges of the storage node 300.

After identifying the storage node 300, the service front-end node 100 transmits the get <key1> to the storage node 300. The storage node 300 extracts a key1 value from the received, get <key1>, and performs a look-up caching process to search for a cache where a key corresponding to the key1 value has been stored. When searching for the data corresponding to the key, the storage node 300 provides the cache response, cache response <key, value>, to the service front-end node 100. The service front-end node 100 provides the data received from the storage node 300, as a response to the get request of the client node 1, get_response <key, value>. That is, when receiving the get operation request from the client node 1, the data storage system 10 of the present invention looks up the cache, and then obtains, when a cache miss exists, a value through a corresponding storage node.

Figure 8:
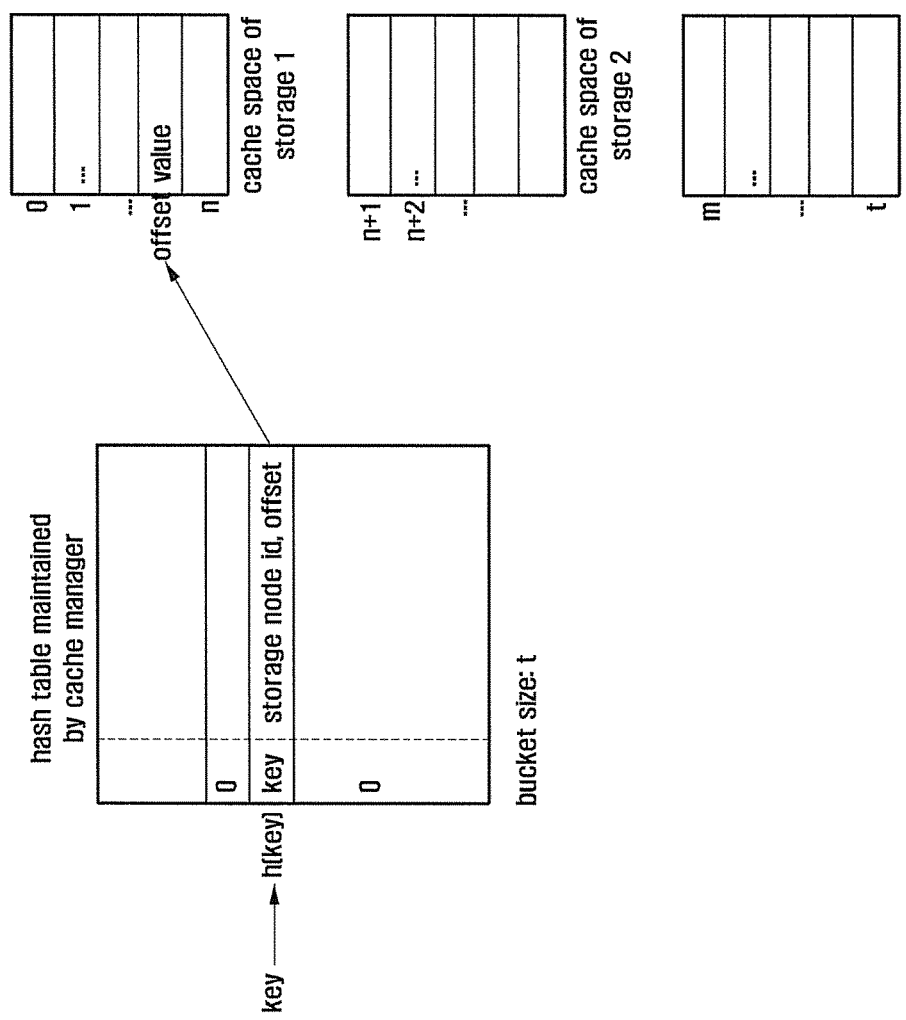
FIG. 8 is a diagram showing a key-value cache using the idle memory of a storage node according to the present invention.

FIG. 8 is a diagram showing a logical structure of the cache space in the data storage system 10 of the present invention, where a memory of a storage node is used as a key-value cache.

Referring to FIG. 8, the cache manager 120 of the service front-end node 100 creates and maintains a hash table. That is, the offset value and the ID of a storage node are distributed to a particular key. The bucket size t of the hash table, managed by one service front-end node 100, may be a value corresponding to the cache space value of all the storage nodes 300. Accordingly, the buckets of all the storage nodes 300 are managed by the cache manager 120 as one continuous array bucket. Accordingly, the service front-end node 100 of the present invention creates a cache cluster with the idle memory of the storage node 300 to dynamically expand the cache size.

The embodiments of the present invention described in the description and drawings, using particular terms, are merely provided to assist in a comprehensive understanding of the invention and are not suggestive of limitation. Although embodiments of the invention have been described in detail above, it should be understood that many variations and modifications of the basic inventive concept herein described, which may be apparent to those skilled in the art, will still fall within the spirit and scope of the embodiments of the invention as defined in the appended claims.

The invention claimed is:

1. A device including a key-value-based data storage components comprising:
   computing nodes each of which comprises a substrate module, a central processing unit (CPU) disposed on the substrate module, a memory disposed on the substrate module and a NAND flash memory for performing a cache storage; and
   a communication interface for connecting the computing nodes, wherein the computing nodes comprise:
   a plurality of storage nodes for storing key-value data physically in the NAND flash memory;
   at least one service front-end node for allocating key ranges to the plurality of storage nodes respectively to configure a key-value-based storage; and
   a storage master node configured as one of the service front-end nodes to manage at least one of the service front-end nodes,
   wherein the at least one service front-end node creates a cache cluster with the idle memory in the NAND flash memory of the plurality of storage nodes respectively allocated to said at least one service front-end nodes, to dynamically expand the cache size,
   wherein the storage master node comprising:
   managing a membership of the at least one service front-end node and the plurality of storage nodes, to join or leave; and
   when the at least one service front-end node is joined, performing a process of key range assign to be controlled by assigning key ranges to the respective joined at least one service front-end node.

2. The device of claim 1, wherein the computing node creates at least one of:
   a first cluster comprising the substrate module on which an SD card/SSD is installed or the substrate module on which a NAND Flash storage is included in the form of System on chip (SoC);

a second cluster cooperating with a plurality of SSDs in which the CPU, memory and NAND Flash storage are mounted; or a third cluster as a micro-server using an SSD through the virtualization of Input-Output (IO).

3. The device of claim 1, wherein the computing nodes allows software components configuring the node to operate as a microkernel-based user-level process and is provided in the form of a library according to the relationships between the software components so as to operate a plurality of modules as one user-level process.

4. The device of claim 1, wherein the at least one service front-end node stores, when receiving a put operation request from a client node, a key value in a particular storage node, and maintains the storage result in a cache.

5. The device of claim 1, wherein the at least one service front-end node looks up, when receiving a get operation request from a client node, a cache, and obtains a value through a corresponding storage node when a cache miss exists.

6. The device of claim 1, wherein software components included in the service front-end node, the storage master node and the storage node are operated on a microkernel or a monolithic kernel.

7. A method of operating a key-value-based data storage components comprising:
  requesting, by a client node, a read or write operation of a key-value data;
  according to the operation request, providing, to the client node, a list of at least one or more service front-end nodes for managing a plurality of storage nodes storing the key-value data;
  selecting, by the client node, at least one service front-end node to read or write the key-value data; and
  according to the request from the client node, writing or reading, by the selected service front-end node, the key-value data to or from a particular storage node, and providing the key-value data to the client node; and
  creating, by the service front-end node, a cache cluster with an idle memory in a NAND flash memory of the plurality of storage node respectively allocated to said at least one service front-end nodes, and dynamically expanding a cache size,
  wherein the service front-end node, the storage master node and the plurality of storage node comprise:
  computing nodes each of which comprises a substrate module, a central processing unit (CPU) disposed on the substrate module, a memory disposed on the substrate module and a NAND flash memory for performing a cache storage; and
  a communication interface for connecting the computing nodes, wherein the storage master node comprising:
  managing a membership of the at least one service front-end node and the plurality of storage nodes, to join or leave; and
  when the at least one service front-end node is joined, performing a process of key range assign to be controlled by assigning key ranges to the respective joined at least one service front-end node.

8. The method of claim 7, further comprising:
  selecting one of the service front-end nodes as a storage master node; and
  creating and managing, by the storage master node, the list of the service front-end nodes.

9. The method of claim 7, further comprising:
  allocating, by the service front-end node, key ranges to the plurality of storage nodes.

10. The method of claim 7, wherein the provision comprises:
  receiving, by the service front-end node, a put operation request from a client node;
  storing a key value in the particular storage node; and
  maintaining, by the particular storage node, the storage result in the cache.

11. The method of claim 7, wherein the provision comprises:
  receiving, by the service front-end node, a get operation request from the client node;
  looking up a cache by the service front-end node; and
  obtaining, by the service front-end node, a value through a corresponding storage node when a cache miss exists.

12. The method of claim 7, wherein software components included in the service front-end node, the storage master node and the storage node are operated on a microkernel or a monolithic kernel.

13. The method of claim 7, further comprising one of the following:
  creating a cluster for the key-value-based data storage components by the computing nodes that comprises a substrate module on which an SD card/SSD is installed or a substrate module on which a NAND Flash storage is included in the form of System on chip (SoC);
  creating a cluster for the key-value-based data storage components by the computing nodes cooperating with a plurality of SSDs in which the CPU, memory and NAND Flash storage are mounted; and creating a cluster for the key-value-based data storage components by the computing nodes implemented as a micro-server using an SSD through the virtualization of Input-Output (IO).

* * * * *